(12) United States Patent
Sarkar et al.

(10) Patent No.: US 7,036,096 B1
(45) Date of Patent: Apr. 25, 2006

(54) ESTIMATING CAPACITANCES USING INFORMATION INCLUDING FEATURE SIZES EXTRACTED FROM A NETLIST

(75) Inventors: Aveek Sarkar, Mountain View, CA (US); Yongning Sheng, Sunnyvale, CA (US); Peter F. Lai, San Jose, CA (US); Rambabu Pyapali, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 241 days.

(21) Appl. No.: 10/657,431

(22) Filed: Sep. 8, 2003

(51) Int. Cl.
*G06F 17/50* (2006.01)

(52) U.S. Cl. .................... 716/1; 716/5; 716/11; 716/18

(58) Field of Classification Search ............... 716/1, 716/5, 6, 10, 13, 11, 18
See application file for complete search history.

(56) References Cited

U.S. PATENT DOCUMENTS 6,550,050 B1 * 4/2003 Hosono et al. .............. 716/13

* cited by examiner

*Primary Examiner*—Thuan Do
(74) *Attorney, Agent, or Firm*—Zagorin O'Brien Graham LLP

(57) ABSTRACT

The capacitances of one or more inputs/outputs of a circuit are estimated by using an extraction tool (120) to extract information associated with the inputs/outputs from a netlist. The information includes information associated with circuit devices directly connected to the inputs/outputs, particularly information related to device connectivity and the feature sizes of the device. Once the information is extracted, a capacitance determination element (130) aggregates the feature sizes of all the circuit devices connected to each respective input or output, to obtain aggregate feature sizes for each respective input/output. The aggregate feature size is used in determining the total capacitance of the input/output. The total capacitance thus determined can be provided to a timing analysis tool (140), which uses the total capacitance of each input or output to generate a timing model for the circuit.

28 Claims, 3 Drawing Sheets

ESTIMATING CAPACITANCES USING INFORMATION INCLUDING FEATURE SIZES EXTRACTED FROM A NETLIST

FIELD OF THE INVENTION

This invention relates generally to estimating the capacitances of circuit inputs and outputs, and more particularly to estimating input or output capacitances using information extracted from a netlist.

BACKGROUND

As the speed at which processors and other circuits operate has increased, the focus of many circuit design techniques has shifted towards ensuring compliance with stringent timing requirements. To make sure that circuits they design conform to these stringent timing requirements, circuit designers use a number of different timing prediction/modeling tools. Circuit designers use these tools to estimate the time it takes a signal to travel from point to point within a circuit, from a circuit input to a circuit output, etc.

A typical timing analysis tool estimates the time it takes a signal to travel a path from a circuit input to a circuit output by summing the delays encountered by the signal as it passes through each device or circuit portion in the path. In most cases, an accurate estimate of a path's timing response requires the tool to know the circuit's input and output capacitances. If the tool uses an incorrect capacitance value for any or all of the circuit inputs or outputs, error can be introduced, and the estimated timing value may be incorrect. The capacitance of circuit inputs and outputs may be particularly critical when the timing tool is also used to estimate signal phase shifts.

Traditionally, determining the capacitance of inputs and outputs of custom designed circuits has been performed manually. One method used involves simulating a circuit path using a Simulation Program for Integrated Circuits Emphasis (SPICE), or some similar modeling tool. The circuit designer then uses SPICE to simulate the circuit paths response to a voltage source. By toggling the simulated voltage source and measuring the response of the input node, the circuit designer can determine the capacitance of the input node. The same manual process is usually repeated for one or two additional circuit inputs, and the capacitance values of the remaining circuit inputs are assumed to be the same as the capacitance values obtained for the simulated inputs. The capacitance of the outputs is determined in much the same way.

Because determining capacitance manually is relatively slow, only a few inputs and outputs are actually simulated—particularly where a large number of inputs or outputs are involved. For example, if a circuit being designed has 256 inputs, a circuit designer generally simulates only two or three inputs, and uses the simulated capacitances of those two or three inputs to estimate the capacitance of the remaining inputs. Estimating capacitance for only a few of the inputs and outputs can save time, but is potentially less accurate than performing simulations on each input and output.

It would be advantageous, therefore, if the capacitance of each input and output could be determined quickly, without introducing possible error by assuming the capacitance of un-simulated inputs and outputs.

SUMMARY

The capacitance of a circuit input or output is estimated using information extracted from a netlist. The netlist includes a description of a circuit design, and is usually formatted for use by one or more timing analysis tools. Included in the netlist is information describing circuit inputs, circuit elements, and how the circuit elements are connected to each other and to the outputs. The information extracted from the netlist includes information associated with circuit devices connected directly to one or more of the circuit's inputs or outputs. In particular, the extracted information is related to device connectivity and to feature sizes of the directly connected devices. The feature sizes of the directly connected devices are aggregated, and the aggregate feature size is used in determining the total capacitance of the input or output.

For example, assume that four devices having individual features of size X micrometers are directly connected to a particular circuit input being examined. The aggregate feature size will be 4X micrometers. If the capacitance of a feature is known to be C Coulombs per micrometer, then the capacitance of a feature having an aggregate feature size of 4X will be 4XC Coulombs. If the capacitance of all device features directly connected to the circuit input is known, then the capacitance of the circuit input can be determined. The capacitance thus determined can be provided to a timing analysis tool, which uses the capacitance to generate a timing model for the circuit.

In a particular embodiment, all or substantially all of the inputs and outputs of a circuit are identified from the netlist, and information associated with circuit devices connected directly to each of the inputs and outputs is extracted. The capacitances of each individual circuit input and output are determined, and are provided to a timing analysis tool for use in generating timing estimates.

In one form, after a timing analysis tool produces a timing model of the circuit using the capacitance values for the circuit inputs, the timing model is used to generate a circuit design. The circuit design is then encoded onto a computer readable medium product. In another form, methods similar to those described above are encoded onto a computer readable medium as a program of executable instructions. The computer readable medium may then be executed by a computer such that one or more of the methods discussed herein is performed.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
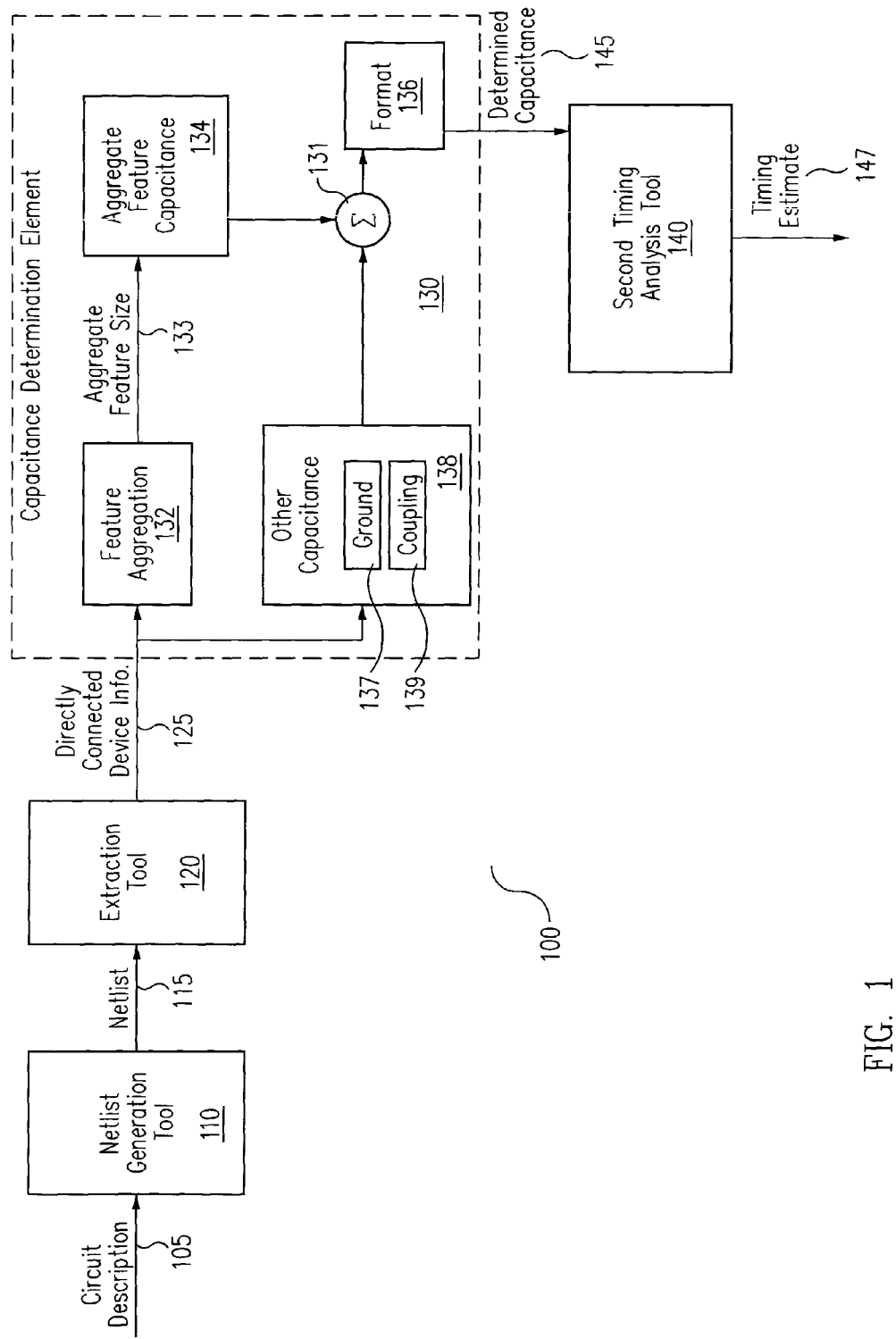
FIG. 1 is a block diagram of a system according to an embodiment of the present invention.

FIG. 1 illustrates a system 100 according to one embodiment of the present invention. System 100 includes netlist generation tool 110, extraction tool 120, capacitance determination element 130, and second timing analysis tool 140. The various elements of system 100 are used to generate timing estimates for signal paths through a circuit described by circuit description 105.

System 100 receives circuit description 105 at netlist generation tool 110. Circuit description 105 is a description of the circuit or circuit portion to be modeled, and may be a node level, component level, layout, schematic entry or some other suitable circuit description usable by netlist generation tool 110. Circuit description 105 is provided to netlist generation tool 110, which may be a commercially available netlisting tool such as OPUS or RCES. Those skilled in the art will recognize that other tools may be employed, consistent with the teachings set forth herein, to generate a netlist from circuit description 105.

In at least one embodiment, netlist generation tool 110 generates a netlist, such as circuit netlist 115, which includes information about the circuit described by circuit description 105. The information included in netlist 115 may include information about the number of devices, wires, nodes, etc. in the circuit. It will be appreciated that the term "wires", as used herein, is used in a broad sense to include all types of conductive paths used to provide electrical connectivity. Thus, the term "wires" includes not only extruded lengths of copper, aluminum, and various other types of conductive material, but also circuit traces, vias, and various other conductive connections that may be found in discrete and/or integrated circuits.

Also included in netlist 115 are connectivity information, indicating which devices in the circuit are coupled to each other; input/output (I/O) information, indicating the location, type, arrangement, etc. of I/O devices; grouping information, indicating how various circuit devices are grouped into blocks, paths, or other conceptual units; and device information. The device information typically includes information identifying each device by type, function, or otherwise; information associated with the manufacturing parameters and/or processes to be used in fabricating particular devices or group of devices; and information indicating feature sizes, dimensions, and the like.

Netlist generation tool 110 provides circuit netlist 115 to extraction tool 120, which extracts information associated with circuit devices connected directly to each input of the circuit described by netlist 115. Extraction tool 120 may be a custom or commercial netlisting tool configured to extract only directly connected device information 125 from netlist 115. Although not illustrated, extraction tool 120 may extract a netlist directly from circuit description 105, without requiring netlist generation tool 110 to generate an intermediate netlist. In such a case, extraction tool 120 generates a netlist for directly connected devices, and omits generating a netlist for devices not of interest.

Alternatively, extraction tool 120 may initially extract a standard suite of information that includes more information than needed, and then perform a second selection process to select only the information associated with directly connected devices to provide to capacitance determination element 130. In at least one embodiment, extraction tool 120 extracts information for all or substantially all inputs and outputs of a circuit or circuit block. Extraction tool 120 may, however, be used to extract information associated with individual inputs and outputs or groups of inputs and outputs to facilitate a more targeted circuit analysis.

In one embodiment, directly connected device information 125 includes information related to device connectivity and feature sizes. The information related to device connectivity may include circuit layout information such as the distance between an input or output and a particular device, the length of connecting wires, traces, conductive paths, etc. The information related to feature sizes may include the length, width, and depth of various device features, the location and size of conductive paths, and any other information that might be used for determining the capacitive effect of the feature on the input or output to which the feature is connected. For example, if the circuit being processed includes a transistor (the device) with its control gate (the feature) connected to a particular input of the circuit, the directly connected device information 125 might indicate that the transistor is an N-type device with a gate width of 6 microns, and a diffusion length of about 0.1 micrometers.

Capacitance determination element 130 receives directly connected device information 125, determines the total capacitance of one or more inputs or outputs, and provides determined capacitance 145 to second timing analysis tool 140. In determining the capacitance of each circuit input and output, capacitance determination element 130 uses feature aggregation element 132 to determine an aggregate feature size, aggregate feature capacitance element 134 to determine the capacitance of a hypothetical feature having a feature size equivalent to the aggregate feature size, other capacitance element 138 to determine capacitance contributed by cross coupling, capacitance to ground, etc. Capacitance determination element 130 uses summing element 131 to add the capacitance determined by aggregated feature capacitance element 134 and other capacitance element 138 to arrive at a total estimated capacitance for each circuit input or output being considered. Capacitance determination element 130 also includes format element 136 for putting the total capacitance of each circuit input or output in a form suitable for use by second timing analysis tool 140.

Feature aggregation element 132 aggregates the feature sizes of all devices directly connected to a particular circuit input or output being processed. For example, assume that the gates of four N-type metal oxide semiconductor (NMOS) transistors and four P-type metal oxide semiconductors (PMOS) are directly connected to a circuit input being analyzed. Assume further that the gates of the NMOS transistors are each six micrometers wide and the gates of the PMOS transistors are each three micrometers wide. Feature aggregation element 132 will aggregate all of the gate widths as follows: 4 NMOS gates of 6 microns each yields an aggregate NMOS gate width of 24 microns, and 4 PMOS gates of 3 microns each yields an aggregate PMOS gate width of 12 microns. Therefore, the aggregate gate width directly connected to the input being analyzed is 36 microns.

Note that the terms aggregate, aggregation, etc. as used in the present disclosure are used consistent with their general definitions relating to collecting, grouping or otherwise gathering together otherwise separate elements. For simplicity of illustration, the present disclosure focuses primarily on aggregating feature sizes by simple addition. Feature sizes may be aggregated, however, using methods other than simple addition of feature sizes. The feature sizes may be aggregated using more complex mathematical and/or modeling relationships as desired.

Note that different types of features may be aggregated if desired. In the example above, the gates of both NMOS and PMOS transistors are aggregated. Likewise gate widths, source/drain widths, diffusion widths, etc. may also be grouped to generate a single aggregate feature width, and lengths of features from different device types made by different processes can also be aggregated if desired. Note that although width is the only feature size used in the above examples, other suitable dimensions of a feature may be used in a similar manner by feature aggregation element 132 to generate an aggregate feature size.

In addition to aggregating different feature types, multiple dimensions of a particular feature may be used to generate an aggregate feature size. For example length and width may be used to generate an aggregate feature size based on area, and length, width and height may be used to generate an aggregate feature size based on volume. Note also that in appropriate circumstances, a length of one feature may be aggregated with a width of another feature to generate an aggregate feature size. Such an aggregation may be appropriate where, for example, a gate width and a drain length both contribute capacitance to an input or output being analyzed.

Feature aggregation element 132 provides the aggregate feature size 133 to aggregate feature capacitance element 134. Aggregate feature capacitance element 134 determines the capacitance of a hypothetical feature having a feature size equivalent to the aggregate feature size. For example, if feature aggregation element 132 aggregates the gate widths of eight transistors to obtain an aggregate feature size of 36 microns, aggregate feature capacitance element 134 determines the capacitance of a single transistor having a gate width of 36 microns. In one embodiment, aggregate feature capacitance element 134 determines the aggregate feature capacitance by multiplying the aggregate feature size by a known capacitance value per feature size. For example, assume it is known that the capacitance per micrometer of gate width is about 1 femtofarad/micrometer. If the aggregate feature size is a gate width of 36 micrometers, then the capacitance value will be 36×1 femtofarad/micrometer=36 femtofarads.

The known capacitance per unit size can be determined by aggregate feature capacitance element 134 from a lookup table, or in some other suitable manner. In at least one embodiment, the process to be used in fabricating the circuit being analyzed is precharacterized, and the precharacterized values are provided to capacitance determination element 130 concurrently with directly connected device information 125.

Other capacitance element 138 includes ground element 137 and coupling element 139. Other capacitance element 138 determines the contribution of wires, traces, and other circuit features or elements not taken into account by aggregate feature capacitance element 134. The elements or features typically handled by other capacitance element 138 include ground and coupling capacitance used to model the timing of the circuit being analyzed. Note that wires may be treated as devices, and so the aggregate length of wires connected to the circuit input can be handled by aggregate feature capacitance element 134 in the same way as other devices. In such a case, other capacitance element 138 may not be required.

In at least one embodiment, directly connected device information 125 includes a list of these ground and coupling. Other capacitance element 138 may handle ground capacitance and coupling capacitance in the same manner. Usually, however, other capacitance element 138 uses ground element 137 for handling ground capacitance, and coupling element 139 for handling coupling capacitance. Separate ground element 137 and coupling element 139 are used because ground capacitances are typically treated as having the value indicated in directly connected device information 125. In contrast, the coupling capacitances are more dependent on the switching characteristics of the wires in the circuit being analyzed. Therefore, the value of coupling capacitances indicated by directly connected device information may be modified or flagged if necessary.

The capacitance values determined by other capacitance element 138 and aggregate capacitance element 134 are combined in a combinational element such as adder 131 to produce a total capacitance of the circuit input or output being analyzed. It will be appreciated that although other capacitance element 138 and aggregated feature capacitance element 134 are shown as separate elements having their outputs combined by adder 131, the capacitance determination functions could be combined into a single capacitance determination element that takes into account some or all of the same capacitance values determined by the separate elements.

The total capacitance of the particular circuit input or output is provided to format element 136 to generate an output, such as determined capacitance 145, which is compatible with second timing analysis tool 140. If only a single circuit input or output is being analyzed, format element 136 may format the output of adder 131, which represents the total capacitance of the circuit input or output being analyzed, and provide the formatted total determined capacitance 145 to second timing analysis tool 140. Alternatively, if multiple circuit inputs and/or outputs are being analyzed, then format element 136 may store the total capacitance determined for each input and output until the total capacitance has been determined for some or all inputs and/or outputs. Format element 136 then formats the capacitance values of all circuit inputs or outputs and provides those values to second timing analysis tool 140. Note that in other embodiments, when the capacitance of multiple circuit inputs or outputs are being analyzed, format element 136 provides the total capacitance of each circuit input or output to second timing analysis tool 140 as each capacitance value is determined.

Second timing analysis tool 140 receives determined capacitance values 145 for one or more circuit inputs or outputs, and generates timing estimate 147 using the determined capacitance value 145. Various timing analysis tools commonly available can be adapted for use with the teachings set forth herein. Furthermore, a single timing analysis tool may be used to perform the functions of both second timing analysis tool 140 and netlist generation tool 110. It should be appreciated that the elements discussed above with reference to FIG. 1 may be implemented as software programs or routines, as hardware elements, or as a combination of hardware elements and software routines.

In at least one embodiment, timing estimate 147 is used in an iterative design process to generate a circuit design. The circuit design thus generated is then be encoded on a computer readable medium product that can be used in a fabrication process, provided to a foundry, used in further design processes, etc.

Figure 2:
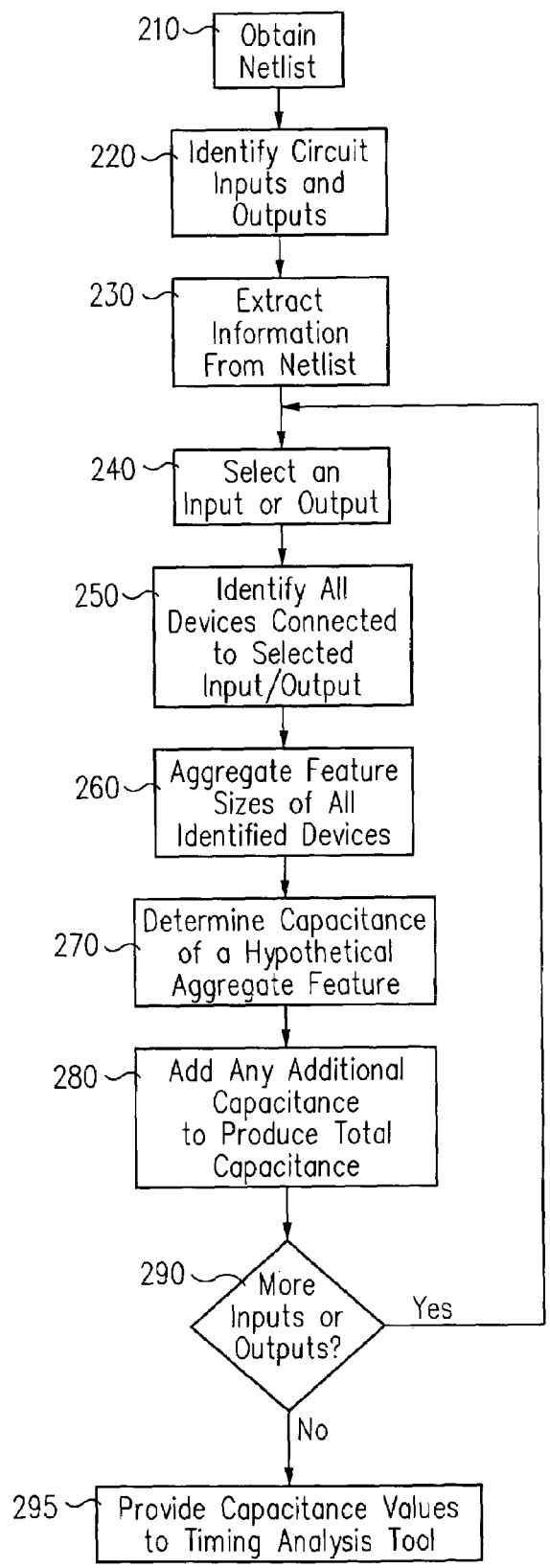
FIG. 2 is a flow chart illustrating a method according to an embodiment of the present invention.

Referring now to FIGS. 1 and 2, a flowchart illustrating the steps of an embodiment of the present invention will be discussed. The method begins at step 210, where a netlist or other suitable description of a circuit to be analyzed is obtained. The method proceeds to step 220, where the circuit's inputs and outputs are identified. In at least one embodiment, the circuit's inputs and outputs are identified during extraction step 230, and thus steps 220 and 230 effectively merge into a single step. In other embodiments, however, circuit inputs and outputs may be performed by analyzing a circuit abstract of the circuit or portion of the circuit to be analyzed. If a multi-bit bus is present, the bus can be decomposed into its individual bits, sometimes referred to as bit blasting, so that the bus can be analyzed as a number of individual inputs.

In extraction step 230, information related to each circuit input or output is extracted from the netlist obtained in step 210. The information extracted includes information related to the feature size and connectivity of circuit features directly connected to each respective input or output. Circuit features may include physical circuit elements to be fabricated, for example transistors, capacitors, resistors, wires, connections, and the like, as well as circuit elements used only for modeling purposes. For example, a circuit timing model may include capacitances that are not intentionally or explicitly called for in a circuit's design. However, the mere presence of two wires, traces, etc, separated by a dielectric creates a capacitance. Although the capacitance formed by the two wires may not have been included in the circuit design explicitly, an accurate timing model of the circuit will include a capacitance to take into account the capacitive effect of the two wires.

Step 240 is performed to select a particular circuit input or output. If the inputs and outputs of the circuit being analyzed are identified from the netlist, then an input or output can be selected from the information extracted in step 230. If, however, the inputs and outputs were identified from analyzing a circuit interface, or some other method, then the input or output may also be selected by hand or otherwise.

Once a circuit input or output has been selected in step 240, step 250 is performed, in which all of the devices connected directly to the selected input are identified from the extracted circuit information, in particular from the connectivity information. The feature sizes of the identified devices are aggregated in step 260, and an aggregate feature size is determined, as discussed above with reference to feature aggregation element 132 (FIG. 1).

In step 270, the capacitance of a hypothetical feature having a feature size equivalent to the aggregate feature size is determined, and in step 280 any additional capacitances due to coupling or ground capacitances, etc. are added to the capacitance of the hypothetical feature to produce a total capacitance.

After the total capacitance of the selected circuit input or output is determined, step 290 is performed to determine if more inputs or outputs are to be analyzed. If more circuit inputs or outputs are to be analyzed, the method returns to step 240, in which another input or output is selected, and the total capacitance of that input or output is determined. If no further inputs or outputs are to be analyzed, then step 295 is performed, in which the capacitance values for all of the inputs and outputs analyzed are provided to a timing analysis tool for use in generating a timing model.

It should be noted that some of the steps of the method illustrated in FIG. 2 may be omitted, or performed in a different order without departing from the teachings set forth herein. For example, step 290 may be executed after step 295, so that the total capacitance value determined in step 280 is always provided to the timing analysis tool in step 295. In such a case, step 290 branches to an ending routine (not illustrated) if no additional inputs or outputs are to be processed; otherwise, step 290 branches back to step 240.

The method illustrated in FIG. 2, as well as the methods discussed earlier with reference to FIG. 1, can be implemented as a program of instructions to be executed using a data processor, and encoded in a computer readable medium. For example, each of the major elements shown in FIG. 1 may be implemented as software executable on a computer (e.g. as a subroutine, a stand alone program, or the like). In at least one embodiment, off-the shelf timing analysis tools are configured to provide the functionality of netlist generation tool 110, extraction tool 120, and second timing analysis tool 140. The output of these off-the-shelf tools is then used in combination with software subroutines, programs, macros, etc. to implement capacitance determination element 130.

In at least one embodiment, additional steps (not illustrated) are performed to generate a circuit design, and then to encode that circuit design onto a computer readable medium product. Various suitable methods of using the timing model generated by the timing analysis tool are known to those skilled in the art. Various methods of encoding information onto a computer readable medium are also well known. The computer readable medium onto which the circuit design, or the program of instructions mentioned earlier, is encoded includes but is not limited to random access memories, read only memories, magnetically encodable tapes and disks, optically encodable tapes and disks propagated signals such as those used in wireless networks, and the like.

Figure 3:
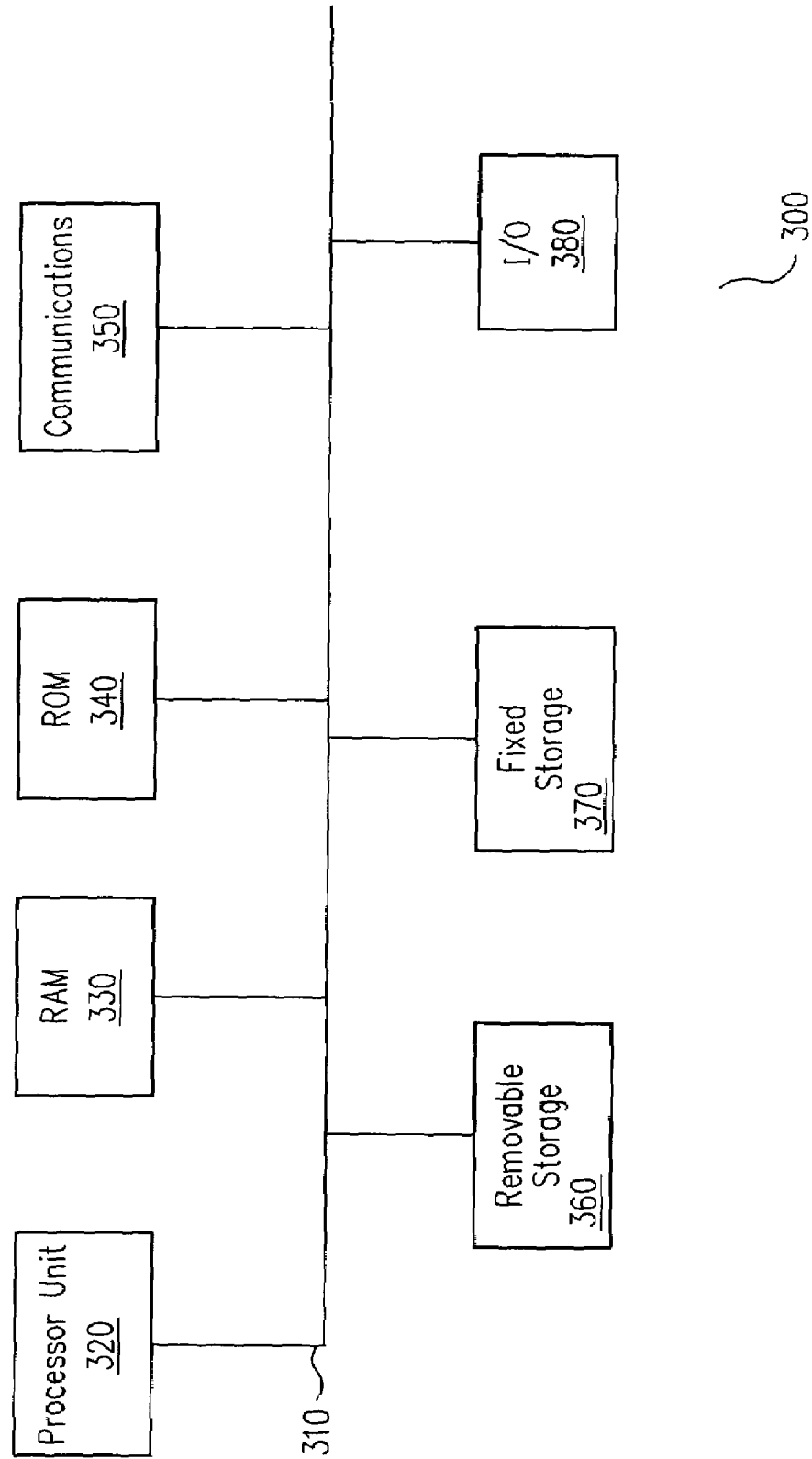
FIG. 3 is a block diagram of a data processor suitable for reading and/or executing a computer readable medium encoded with an integrated circuit design or a program of instructions.

The data processor 300 illustrated in FIG. 3 includes a number of devices connected to a common system bus 310. Processor unit 320 includes one or more devices, commonly referred to as central processing units (CPU) that obtain information to be processed over system bus 310, process the information, and output results to one of the connected devices. RAM 330 and ROM 340 store programs and/or data for execution by processor unit 320. Removable storage 360 may include storage devices having removable media, such as floppy disks, compact disks, tape drives, memory sticks, and the like. Fixed storage 370 includes such devices as hard disk drives and the like that do not have removable media. Generally, both removable storage 360 and fixed storage 370 are used for bulk storage of information and/or programs. The information and programs stored fixed storage 370 and removable storage 360 are usually copied to RAM 330 for faster access by processor unit 320. Finally, communications device 350 includes network interface cards, modulator/demodulators (modems), and the like, while input output unit (I/O) 380 includes devices such as keyboards, speakers, monitors, and pointing devices.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method comprising:
   extracting, from a circuit description describing a circuit, information associated with circuit devices connected directly to an input of the circuit, wherein the extracted information includes information related to device connectivity and feature sizes;

aggregating the feature sizes of the circuit devices to obtain an aggregate feature size; and determining a total capacitance of the input based, at least in part, on the aggregate feature size.

2. The method as in claim 1, further including:

extracting, from the circuit description, the information associated with circuit devices connected directly to each of a plurality of respective inputs and outputs; and for each of the respective inputs and outputs:

aggregating the feature sizes of the circuit devices connected directly to the respective input or output to obtain an aggregate feature size; and determining a total capacitance of the respective input or output based, at least in part, on the aggregate feature size.

3. The method as in claim 1, wherein determining the total capacitance includes determining a capacitance of a hypothetical feature having a feature size equivalent to the aggregate feature size.

4. The method as in claim 1, wherein the information related to device connectivity includes information associated with wires connecting the circuit devices to the input, the method further including:

determining an aggregate capacitance of the wires; and determining the total capacitance of the input based in part on the aggregate capacitance of the wires.

5. The method as in claim 1, further including providing the total capacitance of the input to a timing analysis tool.

6. The method as in claim 5 wherein the circuit description is a netlist.

7. The method as in claim 6, further including generating the netlist using a netlisting tool.

8. The method of claim 1, employed in making a computer readable medium product that encodes an integrated circuit design, the method further comprising:

identifying substantially all inputs and outputs of the circuit;

for each of the identified inputs and outputs:

performing the aggregating of the feature sizes for those of the circuit devices connected directly to the input or output to obtain an aggregate feature size; and determining a total capacitance of the input or output based, at least in part, on the aggregate feature size;

generating an estimated timing response based on the total capacitance;

generating a circuit design using the estimated timing response; and encoding the circuit design onto the computer readable medium product.

9. The method as in claim 8, wherein the information related to device connectivity includes information associated with wires connecting the circuit devices to respective inputs and outputs, the method further comprises for each of the identified inputs and outputs:

determining an aggregate capacitance of the wires connected to the input or output; and determining the total capacitance of the input or output based in part on the aggregate capacitance of the connected wires.

10. The method as in claim 8, wherein the computer readable medium is selected from the group consisting of a random access memory, a read only memory, a magnetic tape, a magnetically encodable disk, an optically encodable tape, or an optically encodable disk.

11. A computer readable medium tangibly embodying a program of instructions, the program of instructions comprising:

at least one instruction executable to extract, from a circuit description describing a circuit, information associated with circuit devices connected directly to an input of the circuit, wherein the information includes information related to device connectivity and feature sizes;

at least one instruction executable to aggregate the feature sizes of the circuit devices to obtain an aggregate feature size; and at least one instruction executable to determine a total capacitance of the input based, at least in part, on the aggregate feature size.

12. The computer readable medium as in claim 11, further including:

at least one instruction executable to extract, from the circuit description, the information associated with circuit devices connected directly to each of a plurality of respective inputs and outputs;

at least one instruction executable to aggregate the feature sizes of the circuit devices connected directly to each input or output to obtain an aggregate feature size for each input or output; and at least one instruction executable to determine a total capacitance of each input or output based, at least in part, on the respective aggregate feature size.

13. The computer readable medium as in claim 11, wherein the at least one instruction executable to determine the total capacitance includes at least one instruction executable to determine a capacitance of a hypothetical feature having a feature size equivalent to the aggregate feature size.

14. The computer readable medium as in claim 11, wherein the information related to device connectivity includes information associated with wires connecting the circuit devices to the input, and wherein the program of instructions further includes:

at least one instruction executable to determine an aggregate capacitance of the wires; and at least one instruction executable to determine the total capacitance of the input based in part on the aggregate capacitance of the wires.

15. The computer readable medium as in claim 11, wherein the program of instructions further includes at least one instruction executable to provide the total capacitance of the input to a timing analysis tool.

16. The computer readable medium as in claim 11, wherein the computer readable medium is selected from the group consisting of a random access memory, a read only memory, a magnetic tape, a magnetically encodable disk, an optically encodable tape, or an optically encodable disk.

17. A method comprising:

identifying substantially all inputs and outputs of a circuit;

extracting, from a circuit description, information associated with circuit devices connected directly to the respective inputs and outputs, wherein the information includes information related to device connectivity and feature sizes;

for each of the identified inputs and outputs:

aggregating the feature sizes of the circuit devices connected directly to the input or output to obtain an aggregate feature size; and determining a total capacitance of the input or output based, at least in part, on the aggregate feature size.

18. The method as in claim 17, wherein the information related to device connectivity includes information associated with wires connecting the circuit devices to respective inputs and outputs, the method further comprising for each of the identified inputs and outputs:

determining an aggregate capacitance of the wires connected to the input or output; and determining the total capacitance of the input or output based in part on the aggregate capacitance of the connected wires.

19. The method as in claim 17, wherein determining the total capacitance includes determining a capacitance of a hypothetical feature having a feature size equivalent to the aggregate feature size.

20. The method as in claim 17, further comprising providing the total capacitance of each of the inputs and outputs to a timing analysis tool.

21. The method as in claim 17 wherein the circuit description is a netlist.

22. The method as in claim 21, further including generating the netlist using a netlisting tool.

23. A system comprising:

means for extracting, from a circuit description describing a circuit, information associated with circuit devices connected directly to an input of the circuit, wherein the information includes information related to device connectivity and feature sizes;

means for aggregating the feature sizes of the circuit devices to obtain an aggregate feature size; and means for determining a total capacitance of the input based, at least in part, on the aggregate feature size.

24. The system as in claim 23, wherein:

the extraction means is for extracting, from the circuit description, the information associated with circuit devices connected directly to each of a plurality of respective inputs and outputs;

the aggregation means is for aggregating the feature sizes of the circuit devices connected directly to each of the plurality of inputs and outputs to obtain an aggregate feature size for each respective input and output; and the determination means is for determining a total capacitance of each of the respective inputs and outputs based, at least in part, on the respective aggregate feature size.

25. The system as in claim 23, wherein the determination means includes hypothetical-feature means for determining a capacitance of a hypothetical feature having a feature size equivalent to the aggregate feature size.

26. The system as in claim 23, wherein the information related to device connectivity includes information associated with wires connecting the circuit devices to the input and the system further includes:

wire aggregation means for determining an aggregate capacitance of the wires; and wherein the determination means is for determining the total capacitance of the input based in part on the aggregate capacitance of the wires.

27. The system as in claim 23, further including providing means for providing the total capacitance of the input to a timing analysis tool.

28. The system as in claim 23, further including a means for generating the circuit description.

* * * * *